United States Patent
Nishimura

(10) Patent No.: US 6,246,602 B1
(45) Date of Patent: *Jun. 12, 2001

(54) FERROELECTRIC STORAGE DEVICE

(75) Inventor: Kiyoshi Nishimura, Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/995,025

(22) Filed: Dec. 19, 1997

(30) Foreign Application Priority Data

Dec. 27, 1996 (JP) ..................... 8-350046
Nov. 26, 1997 (JP) ..................... 9-324143

(51) Int. Cl.[7] .................................. G11C 11/22
(52) U.S. Cl. .................. 365/145; 365/149; 365/121
(58) Field of Search ................... 365/145, 149, 365/121, 117, 65; 382/237

(56) References Cited

U.S. PATENT DOCUMENTS

| | | | |
|---|---|---|---|
| 5,297,077 | * | 3/1994 | Imai et al. ............... 365/145 |
| 5,309,392 | * | 5/1994 | Ootsuka et al. ........... 365/145 |
| 5,517,445 | * | 5/1996 | Imai et al. ............... 365/145 |
| 5,539,279 | * | 7/1996 | Takeuchi et al. .......... 365/145 |
| 5,715,190 | * | 2/1998 | Honjo et al. ............. 365/149 |
| 5,726,930 | * | 3/1998 | Hasegawa et al. ......... 365/145 |
| 5,768,182 | * | 6/1998 | Hu et al. ................ 365/145 |
| 5,995,669 | * | 11/1999 | Shingu et al. ........... 382/237 |

* cited by examiner

*Primary Examiner*—David Nelms
*Assistant Examiner*—David Lam
(74) *Attorney, Agent, or Firm*—Merchant & Gould P.C.

(57) ABSTRACT

An object of the present invention is to provide a ferroelectric storage device which has long life in use. A switch-signal generating portion 40 automatically generates switch signals in predetermined timing. A reversal-of-polarity controlling portion 36 changes, on the switch signal, the polarity states of ferroelectric storage cells composing an information storage portion 30. After that the reversal-of-polarity controlling portion 36 further performs a certain number of write operations or read-out operations on said ferroelectric storage cell so as to further move the polarity state in the direction of the changed polarity. A gate controlling portion 38 gives a control-of-input-gate signal and a control-of-output-gate signal to an input gate portion 32 and an output gate portion 34, thereby changing states of their operations. Therefore, the polarity state can be changed if required with the same data being stored in the ferroelectric storage cell. That prevent the ferroelectric storage cell from getting the bad electric property (imprint effect).

17 Claims, 13 Drawing Sheets

INPUT GATE

CONTROL-OF-INPUT-GATE SIGNAL
(1:NON-REVERSAL, 0:REVERSAL)

OUTPUT GATE

CONTROL-OF-OUTPUT-GATE SIGNAL
(1:NON-REVERSAL, 0:REVERSAL)

(PRIOR ART)

FERROELECTRIC STORAGE DEVICE

CROSS-REFERENCE TO RELATED APPLICATION

The entire disclosure of Japanese patent applications No. Hei 8-350046 filed on Dec. 27, 1996 and No. Hei 9-324143 field on Nov. 26, 1997 including specifications, claims, drawings and summaries are incorporated herein by reference in their entirety.

BACKGROUND OF THE INVENTION

1. Field of the Invention

This invention relates to a ferroelectric storage device, more particularly, elongation in the life of the ferroelectric storage device.

2. Description of the Earlier Technology

Ferroelectric memories having ferroelectric capacitors are known as nonvolatile semiconductor memories. FIG. 12 shows a part of a conventional ferroelectric memory in a circuit diagram. The conventional ferroelectric memories comprise a ferroelectric capacitor 4 and a capacitor 6 for load. FIG. 13 is a hysteresis curve showing a relationship between voltage and polarity state in the ferroelectric capacitor 4, wherein the voltage means the potential of a bit line BL when voltage of a plate line PL1 shown FIG. 12 is used as a reference potential and the quantity of electric charge is used to show the level of the polarity state.

In FIG. 13, a first polarity state P1 means a state wherein the capacitor 4 has remanence Z1 and a second polarity state P2 means a state wherein the capacitor 4 has remanence Z2, the remanence Z1 corresponding to data "H" and the remanence Z2 corresponding to data "L". Data can be read out of the ferroelectric capacitor 4 by examining which of these polarity states the capacitor 4 has.

To examine which of these polarity states the ferroelectric capacitor 4 has, a voltage Vf is measured which occurs in both ends of the ferroelectric capacitor 4 when a read-out voltage Vp is applied to the plate line PL, after electricity is discharged from the capacitor 6 for a load shown at FIG. 12 and then the bit line BL is made into a floating state.

According to the graphical solution in FIG. 13, when electrostatic capacity of the capacitor 6 for load respects the slope of the line L1 the voltage Vf occurring in both ends of the ferroelectric capacitor 4 is "V1" if the ferroelectric capacitor 4 has the first polarity state P1 and the voltage Vf is "V2" if the second polarity state P2. Therefore, when a reference voltage is predetermined as shown in FIG. 13 it can be examined which of these polarity states the ferroelectric capacitor 4 has by making a comparison between the voltage Vf occurring in read-out operation and the reference voltage Vref.

Data associated with the polarity state can be read out by means of examining the polarity state of the ferroelectric capacitor 4 in this way.

Such a conventional ferroelectric memory as described above, however, has the following problems. There is a bad electric property (which is referred to as "imprint effect") in ferroelectric capacitors wherein the hysteresis curve distorts when the same polarity state is held for long time.

As a result of that, when a long time passes with the same data being stored in the ferroelectric capacitor 4 this ferroelectric capacitor gets the bad electric property. On getting the bad electric property, there changes the voltage Vf occurring in the both ends of the described-above ferroelectric capacitor 4. In particular, when the opposite data has been written into the ferroelectric capacitor 4 having the bad electric property the opposite data can not be read out correctly. That is, as time passes the function of ferroelectric memory storage deteriorates.

SUMMARY OF THE INVENTION

An object of this invention is to provide a ferroelectric storage device which has long life in use as well as to solve such a problem.

A ferroelectric storage device according to the present invention comprises a ferroelectric storage cell which is capable of holding a polarity state to store data, the polarity state being associated with the data, wherein the association between the data and the polarity state is changeable on a switch signal.

A ferroelectric storage device according to the present invention comprises a ferroelectric storage cell which is capable of holding a first polarity state or a second polarity state the direction of which is different from that of the first polarity state, the first and second polarity states being associated with two kinds of data to be stored, wherein on a certain switch signal the polarity state of said ferroelectric storage cell is changed and a certain number of write operations or read-out operations are performed on said ferroelectric storage cell so as to further move the polarity state in the direction of the changed polarity and then the ferroelectric storage cell is changed back into the previous polarity state.

A controlling device for controlling a ferroelectric storage device according to the present invention is characterized in that the ferroelectric storage device comprises a ferroelectric storage cell which is capable of holding a polarity state to store data, the polarity state being associated with the data, wherein the association between the data and the polarity state is changeable on a certain switch signal.

A controlling device for controlling a ferroelectric storage device according to the present invention is characterized in that the ferroelectric storage device comprises a ferroelectric storage cell which is capable of holding a first polarity state or a second polarity state the direction of which is different from that of the first polarity state, the first and second polarity states being associated with two kinds of data to be stored, wherein on a certain switch signal the polarity state of said ferroelectric storage cell is changed and a certain number of write operations or read-out operations are performed on said ferroelectric storage cell so as to further move the polarity state in the direction of the changed polarity and then the ferroelectric storage device is changed from a "non-reversal-of-operation" state to a "reversal-of-operation" state or from a "reversal-of-operation" state to a "non-reversal-of-operation" state, the "non-reversal-of-operation" state being a state wherein write operations input data is written into the ferroelectric storage cell as it is and in read-out operations read-out data is output as it is, and, the "reversal-of-operation" state is a state wherein write operations input data is written into the ferroelectric storage cell as it is reversed and in read-out operations read-out data is output as it is reversed.

A controlling device for controlling a ferroelectric storage device according to the present invention is characterized in that the ferroelectric storage device comprises a ferroelectric storage cell which is capable of holding a first polarity state or a second polarity state the direction of which is different from that of the first polarity state, the first and second polarity states being associated with two kinds of data to be stored, wherein on a certain switch signal the polarity state of said ferroelectric storage cell is changed, and, a certain number of write operations or read-out operations are performed on said ferroelectric storage cell so as to further move the polarity state in the direction of the changed polarity and then the ferroelectric storage cell is changed back into the previous polarity state.

A storage mediums according to the present invention is a computer readable storage medium storing an executable computer program which is used to control a ferroelectric storage device comprising a ferroelectric storage cell which is capable of holding a polarity state to store data, the polarity state being associated with the data, wherein the program makes a computer change the association between the data and the polarity state on a certain switch signal.

A storage medium according to the present invention is a computer readable storage mediums storing an executable computer program which is used to control a ferroelectric storage device comprising a ferroelectric storage cell which is capable of holding a first polarity state or a second polarity state the direction of which is different from that of the first polarity state, the first and second polarity states being associated with two kinds of data to be stored, wherein the program makes a computer, on a certain switch signal, change the polarity state of said ferroelectric storage cell, perform a certain number of write operations or read-out operations on said ferroelectric storage cell so as to further move the polarity state in the direction of the changed polarity and then change the ferroelectric storage device from a "non-reversal-of-operation" state to a "reversal-of-operation" state or from a "reversal-of-operation" state to a "non-reversal-of-operation" state, the "non-reversal-of-operation" state being a state wherein write operations input data is written into the ferroelectric storage cell as it is and in read-out operations read-out data is output as it is and the "reversal-of-operation" state is a state wherein write operations input data is written into the ferroelectric storage cell as it is reversed and in read-out operations read-out data is output as it is reversed.

A storage medium according to the present invention is a computer readable storage medium storing an executable computer program which is used to control a ferroelectric storage device comprising a ferroelectric storage cell which is capable of holding a first polarity state or a second polarity state the direction of which is different from that of the first polarity state, the first and second polarity states being associated with two kinds of data to be stored, wherein the program makes a computer, on a certain switch signal, change the polarity state of said ferroelectric storage cell, perform a certain number of write operations or read-out operations on said ferroelectric storage cell so as to further move the polarity state in the direction of the changed polarity and then change back the ferroelectric storage cell to the previous polarity state.

Though the features of this invention has been shown widely as described above, the features, objects and aspects of the present invention will become more apparent from the detail description of the present invention when taken in conjunction with the accompanying drawings.

DESCRIPTION OF THE PREFERRED EMBODIMENT

Figure 1:
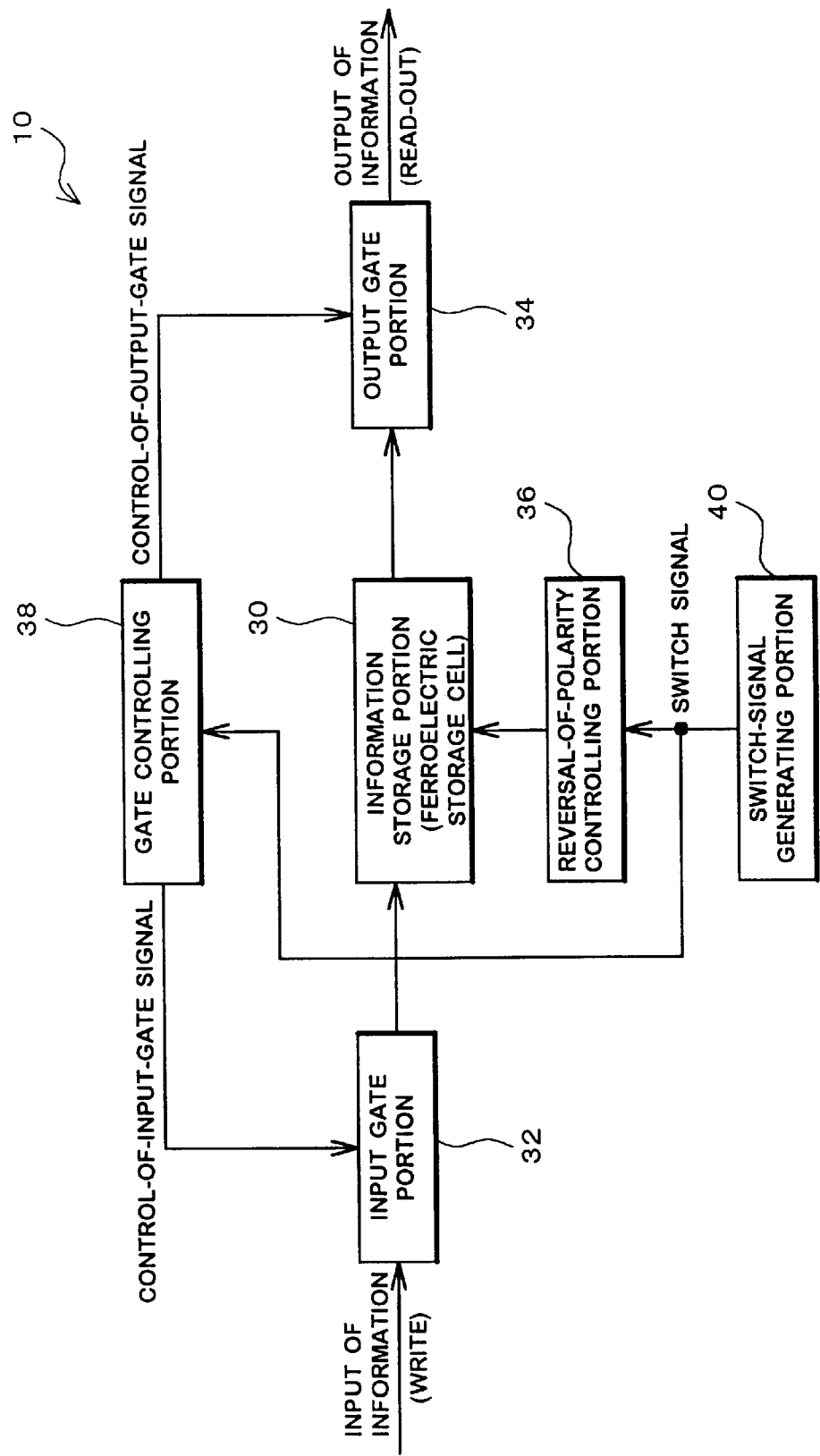
FIG. 1 is a block diagram showing a composition of a ferroelectric memory 10, which is a ferroelectric storage device, according to one embodiment of the present invention.

FIG. 1 shows in a block diagram a composition of a ferroelectric memory 10, which is a ferroelectric storage device, according to one embodiment of this invention. The ferroelectric memory 10 comprises an information storage portion 30, an input gate portion 32, an output gate portion 34, a reversal-of-polarity controlling portion 36, a gate controlling portion 38 and a switch-signal generating portion 40.

The information storage portion 30, which includes a plurality of ferroelectric storage cells, has an ability to write data into and read data out of the plurality of storage cells.

The input gate portion 32 sends input data to be written to the information storage portion 30 with the data being reversed or without the data being reversed on the described-later control-of-input-gate signal. The output gate portion 34 outputs data which is read out of the information storage portion 30 with the data being reversed or without the data being reversed on the described-later control-of-output-gate signal.

The switch-signal generating portion 40 automatically generates switch signals in predetermined timing. The reversal-of-polarity controlling portion 36 reverses the polarity states of ferroelectric storage cells composing the information storage portion 30 on switch signals. The reversal-of-polarity controlling portion 36, after reversing the polarity states of the ferroelectric storage cells, performs a certain number of rewrite operations thereon so as to further move the polarity state in the direction of the reversed polarity.

After that, the gate controlling portion 38 generates the above control-of-input-gate signal and the above control-of-output-gate signal, thereby switching the input and output gates from the "reversal operation state" to the "non-reversal-of-operation" state or from the latter state to the former state. That is, if the input and output gates are in the "non-reversal-of-operation" state before the described-above ferroelectric cells is reversed, the input and output gates are switched to the "reversal-of-operation " state, and, if they are in the "reversal-of-operation" state they are switched to the "non-reversal-of-operation" state.

Here, the "non-reversal-of-operation" state is a state where given data are written into the ferroelectric storage cells without the given data being reversed and data read out of the ferroelectric storage cells are output without the read-out data being reversed. The "reversal-of-operation" state is a state where given data are written into the ferroelectric storage cells with the given data being reversed and data read out of the ferroelectric storage cells are output with the read-out data being reversed.

Figure 2:
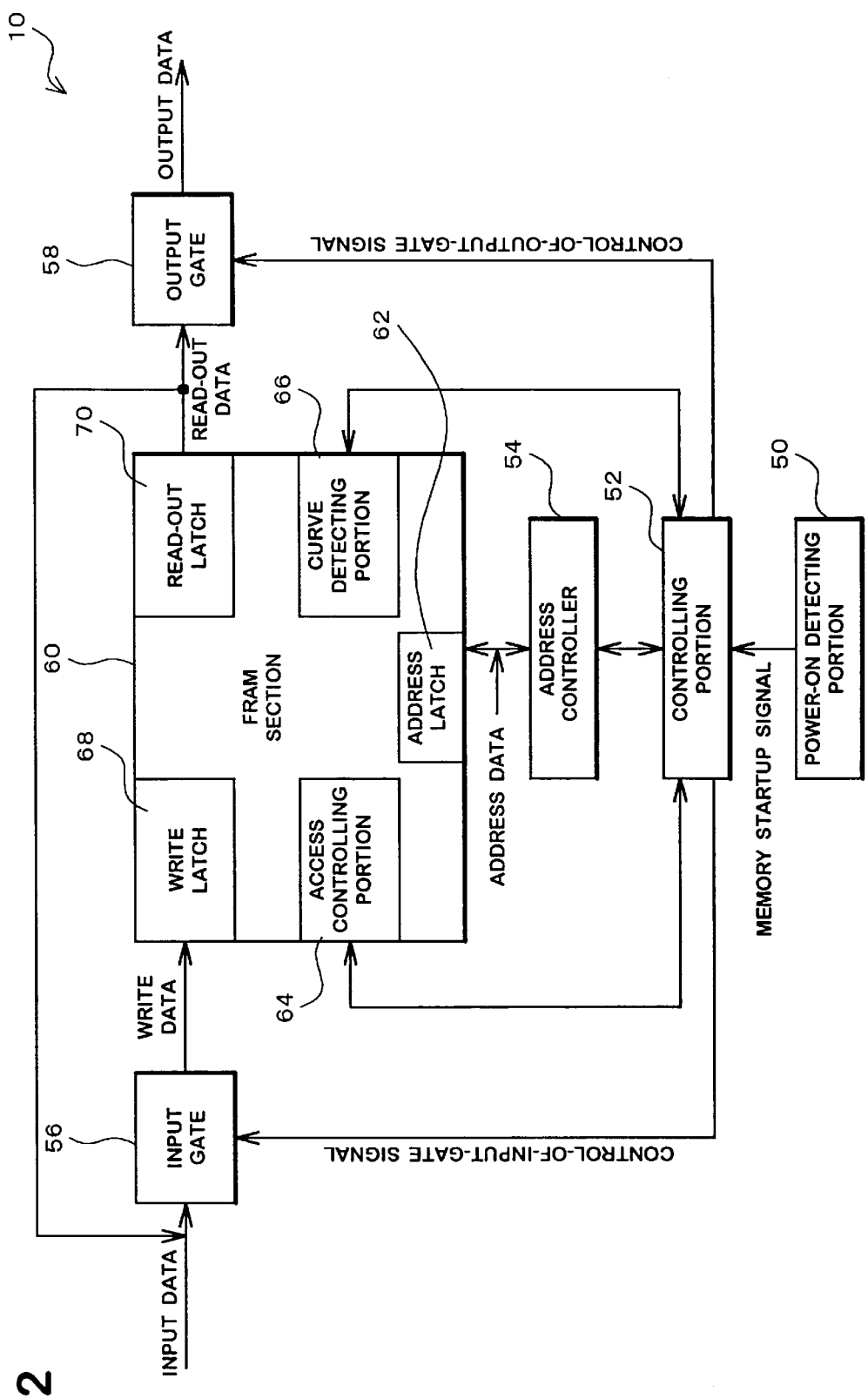
FIG. 2 is a block diagram showing a configuration of a case where a part of the function of the ferroelectric memory 10 of FIG. 1 is fulfill using a logic circuit.

FIG. 2 shows in a block diagram a configuration of a case where a part of the function of the ferroelectric memory 10 of FIG. 1 is fulfilled using a logic circuit. The ferroelectric memory 10 comprises a power-on detecting portion 50 which is used to detect power-on, a controlling portion 52, an address controller 54, an input gate 56, an output gate 58 and a FRAM section 60.

The FRAM section 60 has a matrix structure composed of a plurality of memory cells M11, . . . (which is described later, see FIG. 3,). The FRAM section 60 further comprises an address latch 62 which is used to assign address of the memory cells M11, . . . , an access controlling portion 64 which is used to control read-out or write operations for the memory cells M11, . . . , a curve detecting portion 66 which is used to detect the hysteresis curve of the ferroelectric capacitors C11, . . . , composed of the memory cells M11, . . . , a write latch 68 which is used to temporarily store data to be written into the memory cells M11, . . . , and a read-out latch 70 which is used to store data read out of the memory cells M11, . . . . The power-on detecting portion 50 of FIG. 2 corresponds to the switch-signal generating portion 40 of FIG. 1. The controlling portion 52 corresponds to the reversal-of-polarity controlling portion 36 and the gate controlling portion 38. The address controller 54 and the FRAM section 60 correspond to the information storage portion 30. The input gate 56 corresponds to the input gate portion 32. The output gate 58 corresponds to the output gate portion 34.

Figure 3:
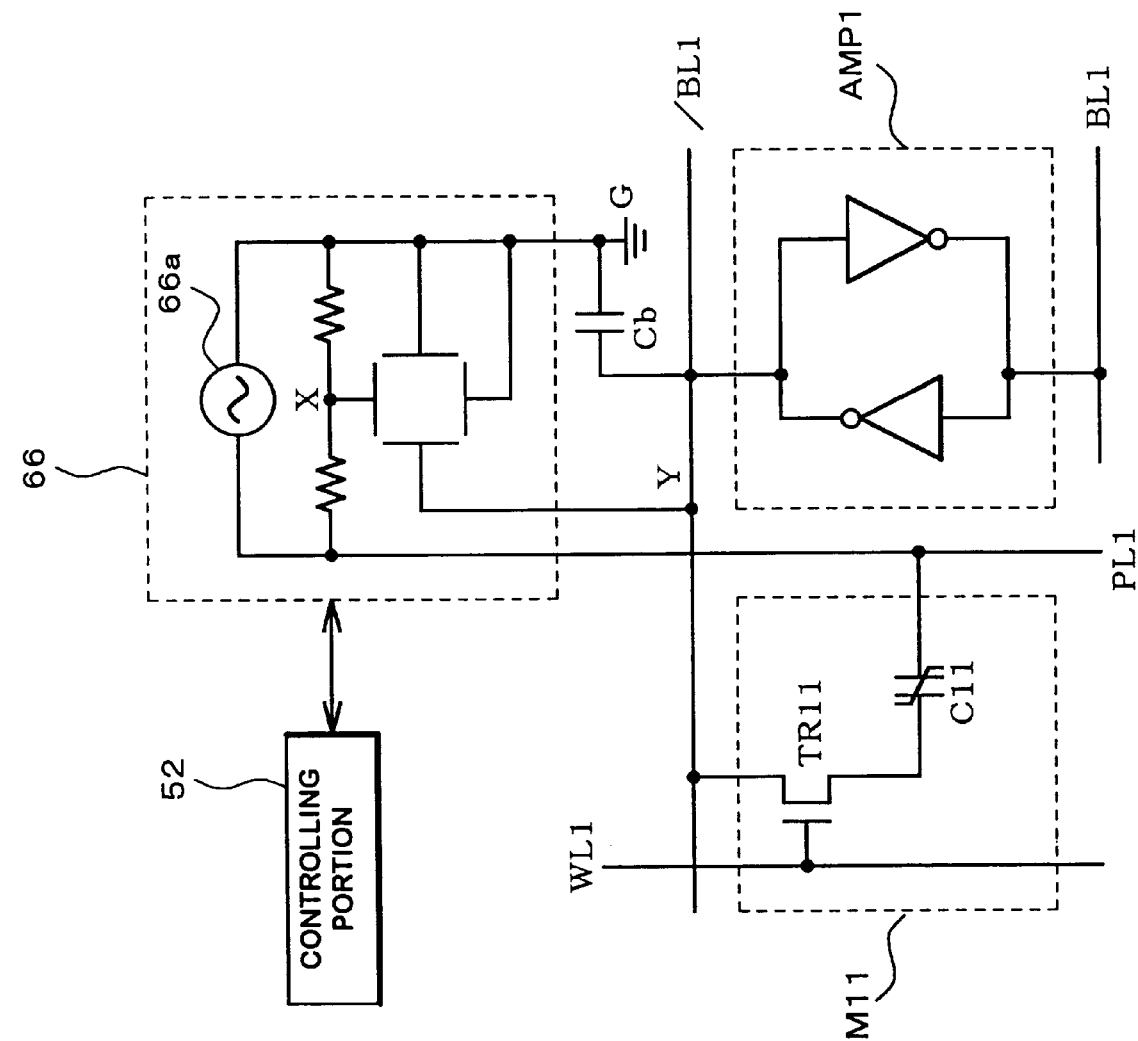
FIG. 3 is a close-up circuit diagram showing the memory cell M11 and its vicinity in the ferroelectric memory 10 of FIG. 2.

FIG. 3 shows the memory cell M11 and its vicinity in a circuit diagram in close-up. The memory cell M11 comprises a ferroelectric capacitor C11 and a selector transistor TR11. One end of the ferroelectric capacitor C11 is electrically connected with a capacitor Cb for load via the selector transistor TR11 and a bit line/BL1 in series. In this embodiment, the capacitor Cb for load is a permanent dielectric capacitor which is given as a parasitic capacity between the bit line/BL1 and the ground. The other end of the ferroelectric capacitor C11 is connected with a plate line PL1.

The gate of the selector transistor TR11 is connected with a word line WL1. To the bit line/BL1 is connected one end of the sense amplifier AMP1, the other end of which is connected to a bit line BL1.

To both the plate line PL1 and the bit line/BL1 is connected the curve detecting portion 66. The curve detecting portion 66, as described later, detects the hysteresis curve of the ferroelectric capacitor C11 according to instructions from the controlling portion 52 and then sends the detected result to the controlling portion 52.

By measuring the potentials of points X and Y when an AC voltage "v" (V=Vp·sin (ωt)) is applied to the ferroelectric capacitor C11, the curve detecting portion 66, which is composed of a typical Sawyer-Tower circuit, can know a hysteresis curve showing a relationship between the AC voltage "v" and the polarized charge "Q" of the ferroelectric capacitor C11. Noted that the voltage Vp is a read-out voltage which is described later.

Figure 7:
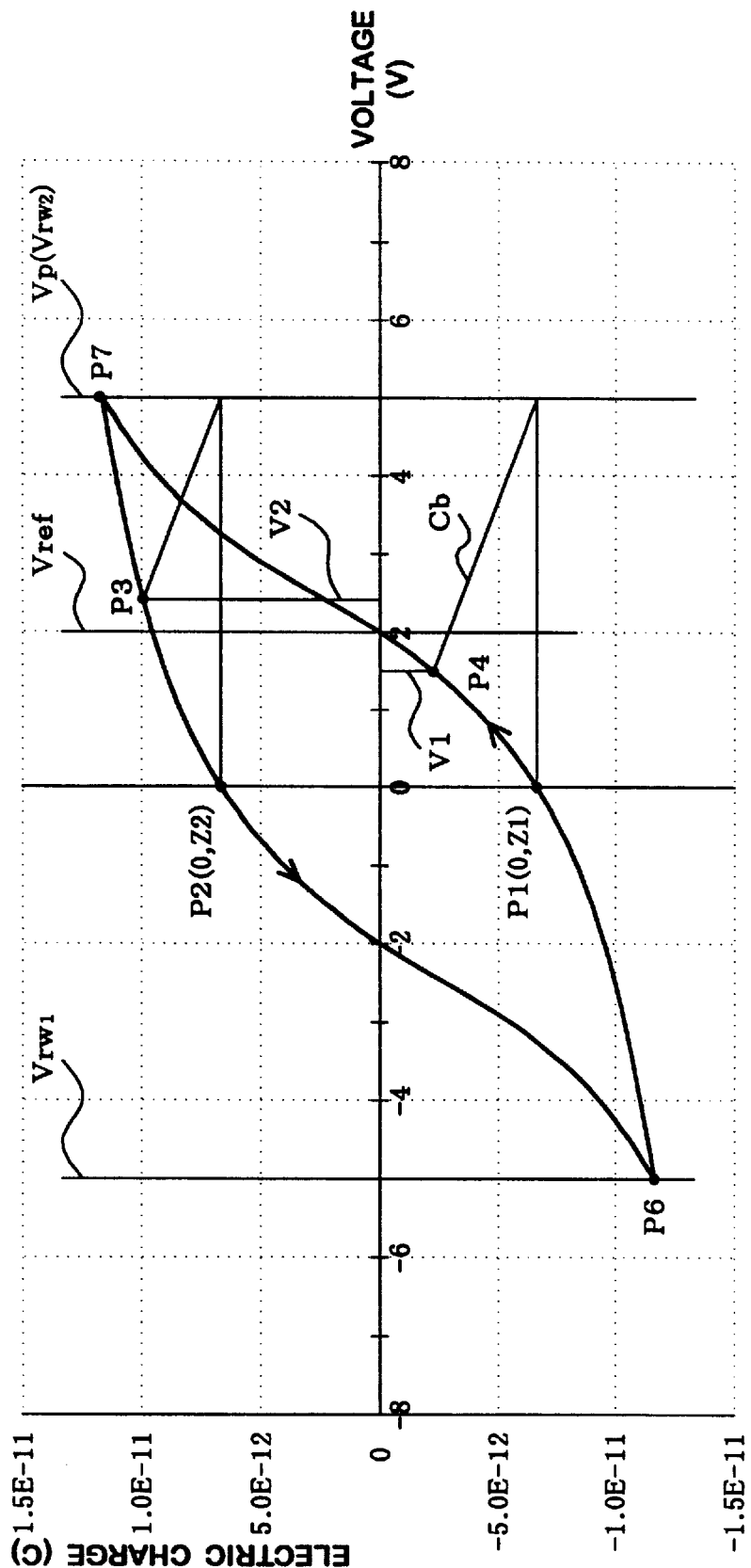
FIG. 7 is a graph which is used to explain operations of a ferroelectric capacitor in the ferroelectric memory 10.

FIG. 7 is a hysteresis curve showing a relationship between the voltage and the polarity state in the ferroelectric capacitor C11 which is not showing the bad electric property (the so-called imprint effect), wherein the voltage means the potential of the plate line PL1 when voltage of the bit line BL1 shown FIG. 3 is used as a reference potential and the corresponding quantity of electric charge is used as the polarity state. In FIG. 7, a first polarity state P1 means a state wherein the capacitor C11 has remanence Z1 and a second polarity state P2 means a state wherein the capacitor C11 has remanence Z2, the remanence Z1 corresponding to data "H" and the remanence Z2 corresponding data "L".

Figure 4A:
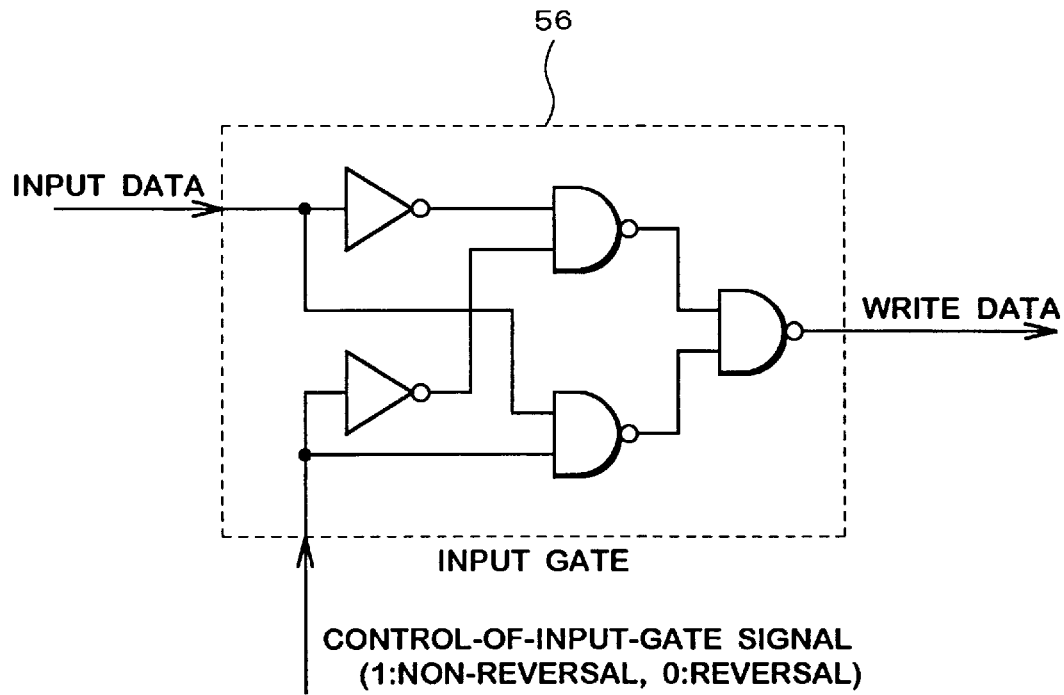
FIG. 4A is a diagram showing a composition example of the input gate 56 in a diagram.
Figure 4B:
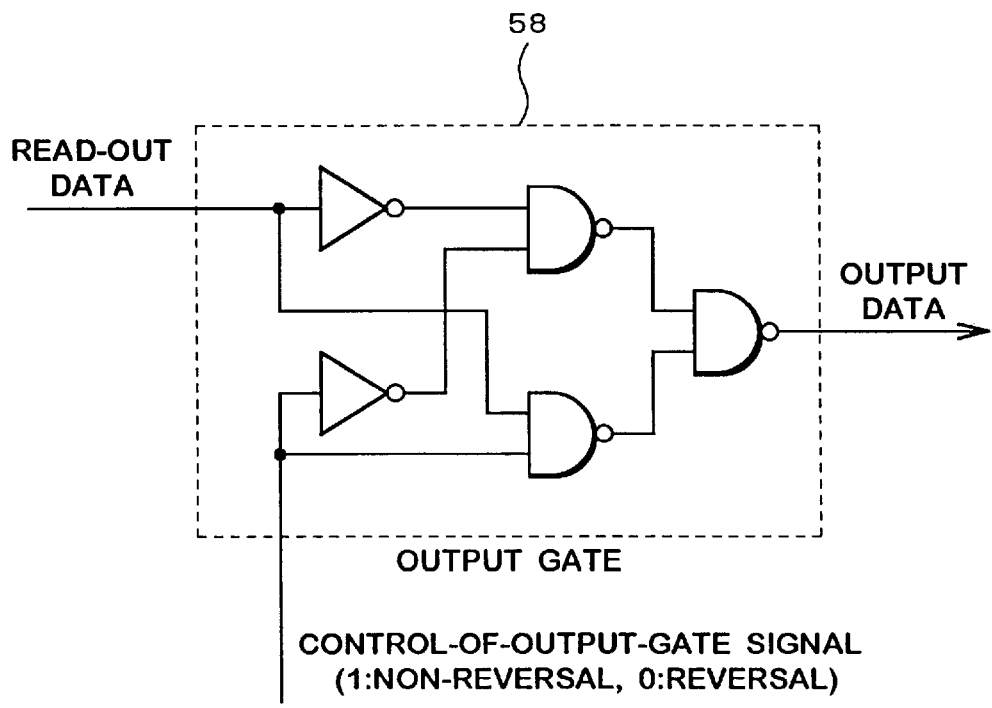
FIG. 4B is a diagram showing a composition example of the output gate 58 in a diagram.

FIG. 4A shows a composition example of the input gate 56 in a diagram. FIG. 4B shows a composition example of the output gate 58 in a diagram.

Figure 5:
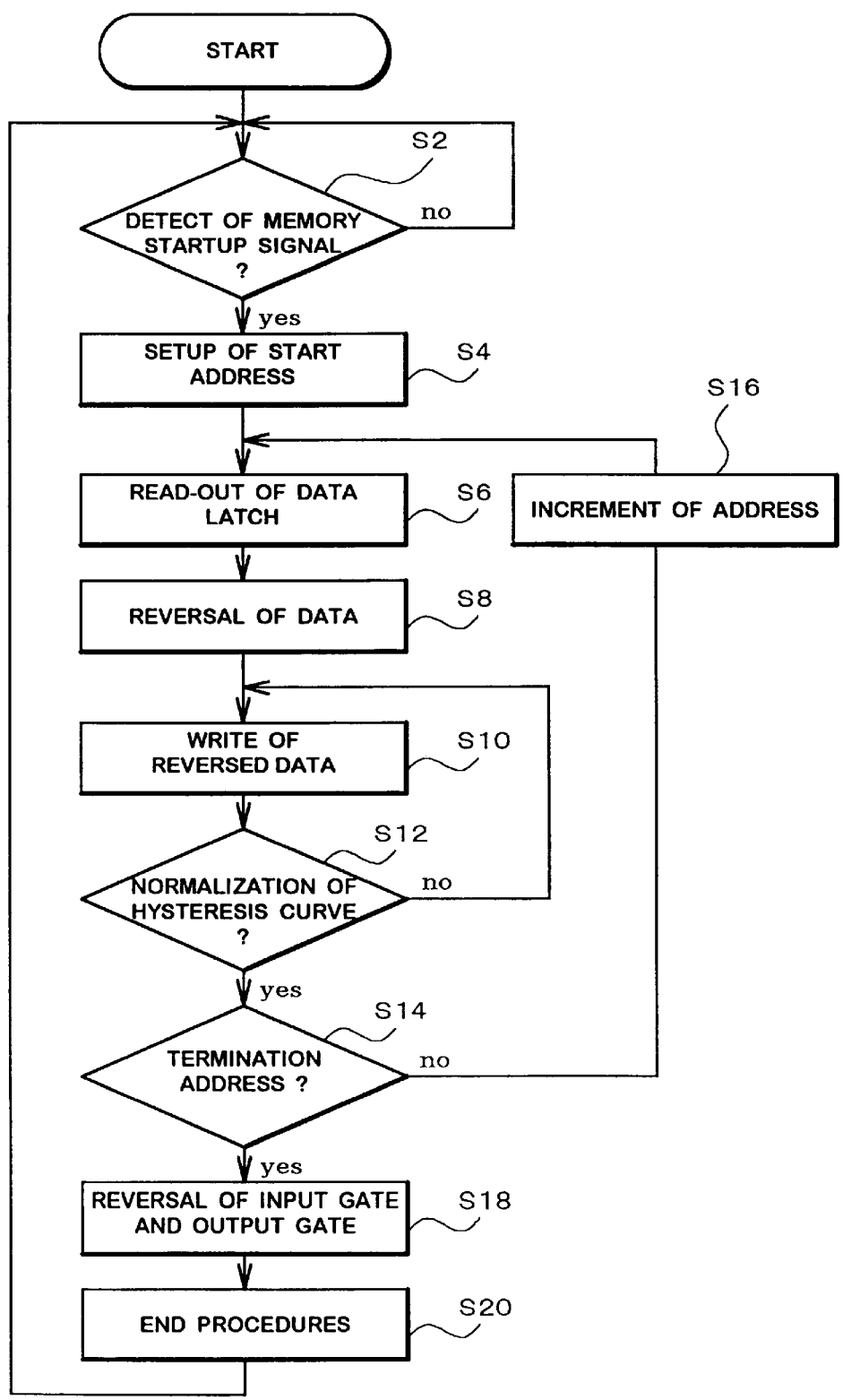
FIG. 5 is a flowchart which is used to explain operations which are performed to prevent the memory cell M11, . . . from getting the bad electric property.

Next, referring to a flowchart shown in FIG. 5 and FIG. 2, there will be described operations which are performed to prevent the memory cell M11, . . . , from getting the bad electric property. The power-on detecting portion 50 shown in FIG. 2, on detecting that the ferroelectric memory 10 has turned on, generates a memory startup signal which is the switch signal.

When the controlling portion 52, which is used to monitor the memory startup signal (at step S2), detects a memory startup signal the portion 52 sets a start address (for example, "0000") to the address controller 54 (at step S4). The address set to the address controller 54 is held in the address latch 62 of the FRAM section 60.

Next, the controlling portion 52 sends a read-out signal to the access controlling portion 64 of the FRAM section 60 and then reads out data which is being stored in a memory cell (here, M11 of FIG. 3) assigned with the address held in the address latch 62. The read-out data is then held the read-out latch 70 of the FRAM section 60 (at step S6).

There will be described operations which are performed to read data out of the memory cell M11 on the read-out signal with reference to a timing chart shown in FIG. 6. First, the bit line/BL1 shown in FIG. 3 is put into a low state "L", thereby discharging electricity from the capacitor Cb for load (see FIG. 6($a$)), and then the bit line/BL1 is got into a state of floating (see FIG. 6($b$)).

Figure 6:
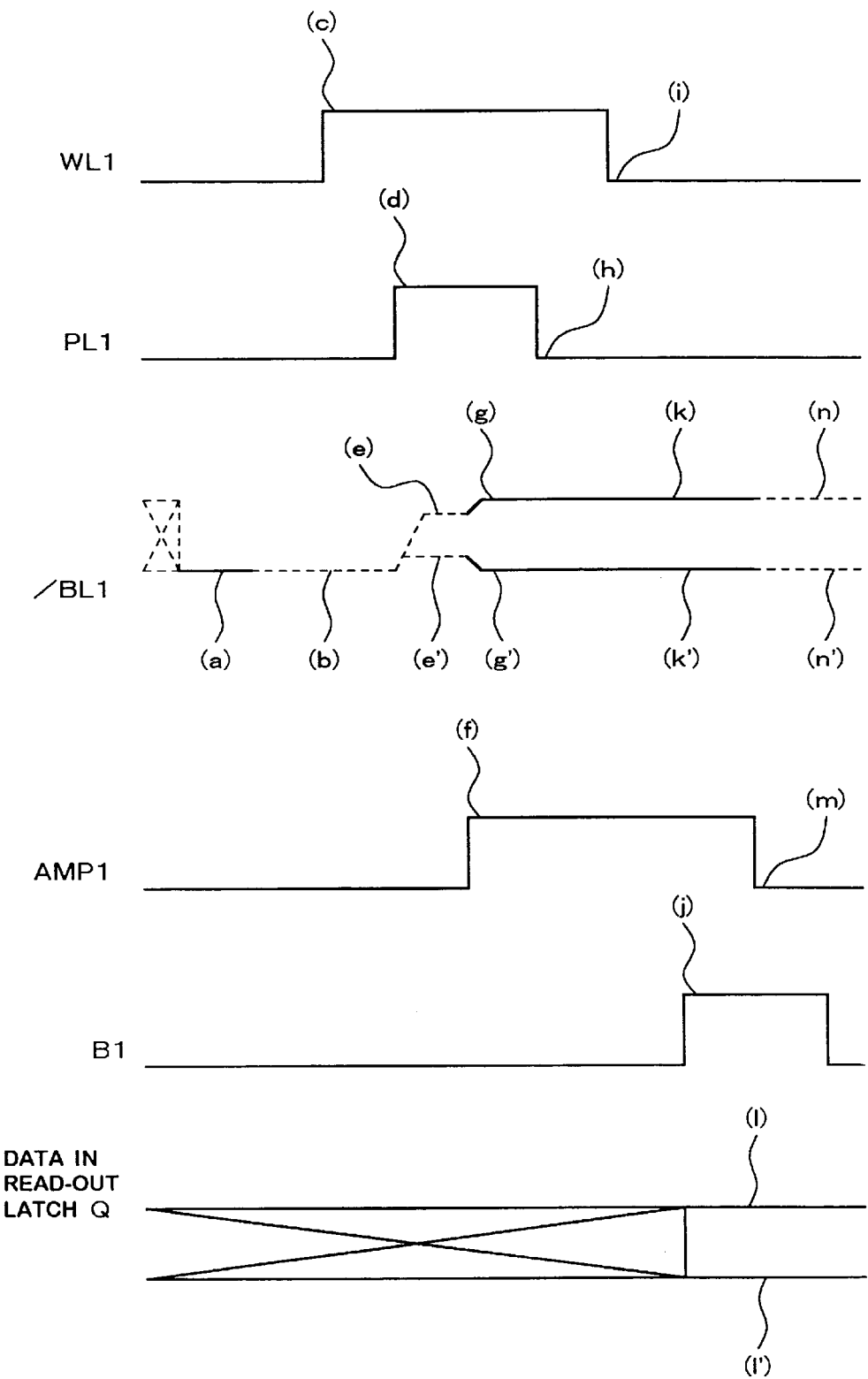
FIG. 6 is a timing chart which is used to explain operations which is performed to read the stored data out of the ferroelectric memory 10.

Next, the word line WL1 is put into a high state "H", thereby switching the selector transistor TR11 on (see FIG. 6($c$)), and then the plate line PL1 is put into a high state "H" (see FIG. 6($d$)).

The plate line PL1 is put into a high state "H", thereby applying a read-out voltage Vp to the both ends of a section where the ferroelectric capacitor C11 and the capacitor Cb are electrically connected in series. As a result of that, as shown in FIG. 7, a partial pressure V1 or V2 occurs in both ends of the ferroelectric capacitor C11 according to the read-out voltage Vp.

According to the graphical solution, the partial pressure V1 is a voltage of the ferroelectric capacitor C11 in the first polarity state P1 and the partial pressure V2 is a voltage of the ferroelectric capacitor C11 in the second polarity state P2. Therefore, when the ground G is used as a reference the potential of the bit line/BL1 is a value shown in FIG. 6(e) if the memory cell M11 has data "H" and is a value shown in FIG. 6(e') if the memory cell M11 has data "L".

Next, the sense amplifier AMP1 is driven (see FIG. 6(f)). The sense amplifier AMP1 makes a comparison of value between the reference voltage Vref (or the threshold voltage) which is given through the bit line BL1 and the partial pressure (V1 or V2) of the ferroelectric capacitor C11. In fact a comparison of value is made between the potential of the bit line BL1 (the reference voltage Vref) and the potential of the bit line/BL1 ("Vp−V1" or "Vp−V2" in FIG. 7) when the ground G is used as a reference.

When the potential of the bit line/BL1 is more than the potential of the bit line BL1 (in a case of "V1" shown in FIG. 7), the sense amplifier AMP1 judges that the data is "H" and then gets the bit line/BL1 to be in the high potential "H" (see FIG. 6(g)). On the other hand, when the potential of the bit line/BL1 is less than the potential of the bit line BL1 (in a case of "V2 shown in FIG. 7"), the sense amplifier AMP1 judges that the data is "L" and then gets the bit line/BL1 to be in the low potential "L" (see FIG. &(g')). Noted that the reference voltage Vref is designed to be between the partial pressure V1 and the partial pressure V2.

Next, the plate line PL1 is put into a low state "L" (see FIG. 6(h)). Then, on getting the plate line PL1 into the low state "L" a potential difference occurs between the plate line PL1 and the bit line/BL1 which is still in the high state "H" when, for example, the stored data is "H". This potential difference, which corresponds to the first rewrite voltage Vrw1 shown in FIG. 7, is applied to both ends of the ferroelectric capacitor C11. As a result of that, the ferroelectric capacitor C11 gets into a polarity state P6 shown in FIG. 7.

When the stored data is "L" a potential difference occurs between the bit line/BL1 and the plate line PL1 which is still in the high state "H" by getting the bit line/BL1 into a low state "L" (see FIG. 6(g')). This potential difference, which corresponds to the second rewrite voltage (which is equal with the read-out voltage Vp), is applied to both ends of the ferroelectric capacitor C11. As a result of that, the ferroelectric capacitor C11 gets into a polarity state P7 shown in FIG. 7. After that, the plate line PL1 is put into the low state "L" (see FIG. (h)), thereby forcing the voltage which is applied to both ends of the ferroelectric capacitor C11 into 0 volt. As a result of that, the ferroelectric capacitor C11 changes back to the second polarity state P2 of FIG. 7.

Next, the word line WL1 is put down into the low state "L" (see FIG. 6(i)), thereby turning the selector transistor TR11 off and getting the ferroelectric capacitor C11 into the floating state.

Next, an output line B1 (not shown) which is designed to control the gate (not shown) of the read-out latch 70 (see FIG. 2) is put high (see FIG. 6(J)), thereby taking the potential "H" (see FIG. 6(k)) or "L" (see FIG. 6) (K')) from the bit line/BL1 into the read-out latch 70 (see FIG. (I) or (I')).

After that, the sense amplifier AMP1 is turned off (see FIG. 6(m)), thereby getting the bit line/BL1 into the floating state again (see FIG. 6(n) and (n')). Finally, the read-out operation is ended by changing the output line B1 back into the low state "L".

In this way, the controlling portion 52 reads out data which is being stored in the memory cell M11 and holds the read-out data in the read-out latch 70 of the FRAM section 60.

Next, the controlling portion 52 gets the control-of-input-gate signal into a logic "0", thereby getting the input gate 56 shown in FIG. 2 into the "reversal-of-operation" state. As a result of that, the data which is being held in the read-out latch 70 at the previous step is reversed with the input gate 56 and then is held in the write latch 68 of the FRAM section 60 (Step S8).

Next, the controlling portion 52 sends a write signal to the access controlling portion 64 and thereby write the reversed data which is being held in the write latch 68 into the memory cell M11 which is assigned with the address held in the address latch 62 (Step S10). That is, the data which is being stored in the memory cell M11 is reversed and then is written into the same memory cell M11 with the data being reversed.

To write the reversed data into the memory cell M11, the word line WL1 is put into a high state "H" so that the selector transistor TR11 gets on. When the reversed data is "L", the bit line/BL1 is put into the low state "L" and the plate line PL1 is put into the high state "H". Then, the ferroelectric capacitor C11 changes from a polarity state P1 to a polarity state P2 through a polarity state P7 in FIG. 7.

On the other hand, when the reversed data is "H", the bit line/BL1 is put into the high state "H" and the plate line PL1 is put into the low state "L". Then, the ferroelectric capacitor C11 changes from a polarity state P2 to a polarity state P1 through a polarity state P6 in FIG. 7.

Next, the controlling portion 52 checks on whether the hysteresis curve of the ferroelectric capacitor C11 composing the memory cell M11 has been normalized or not (Step S12). At the step S12, the controlling portion 52, first, sends a signal for detecting the curve to the curve detecting portion 66. The curve detecting portion 66, on receiving the signal for detecting the curve, works an AC power supply 66a to apply a voltage for AC between the ground G and the plate line PL1, wherein the voltage V for AC is given by the following formulation: V=Vp·sin (ωt). The curve detecting portion 66, then, measures the potentials of points X and Y, and then sends the obtained result to the controlling portion 52. The controlling portion 52 knows from the obtained result of a relationship (that is, a hysteresis curve) between the voltage V for AC which is applied to the ferroelectric capacitor CL1 and the polarized charge Q which the ferroelectric capacitor C11 has.

The controlling portion 52, if the hysteresis curve has been normalized (for example, the hysteresis curve is near to what is shown in FIG. 7), goes to a next step. If the hysteresis curve has been not normalized (for example, the hysteresis curve is near to what is shown in FIG. 8) the step S10 is repeated until it is normalized.

Figure 8:
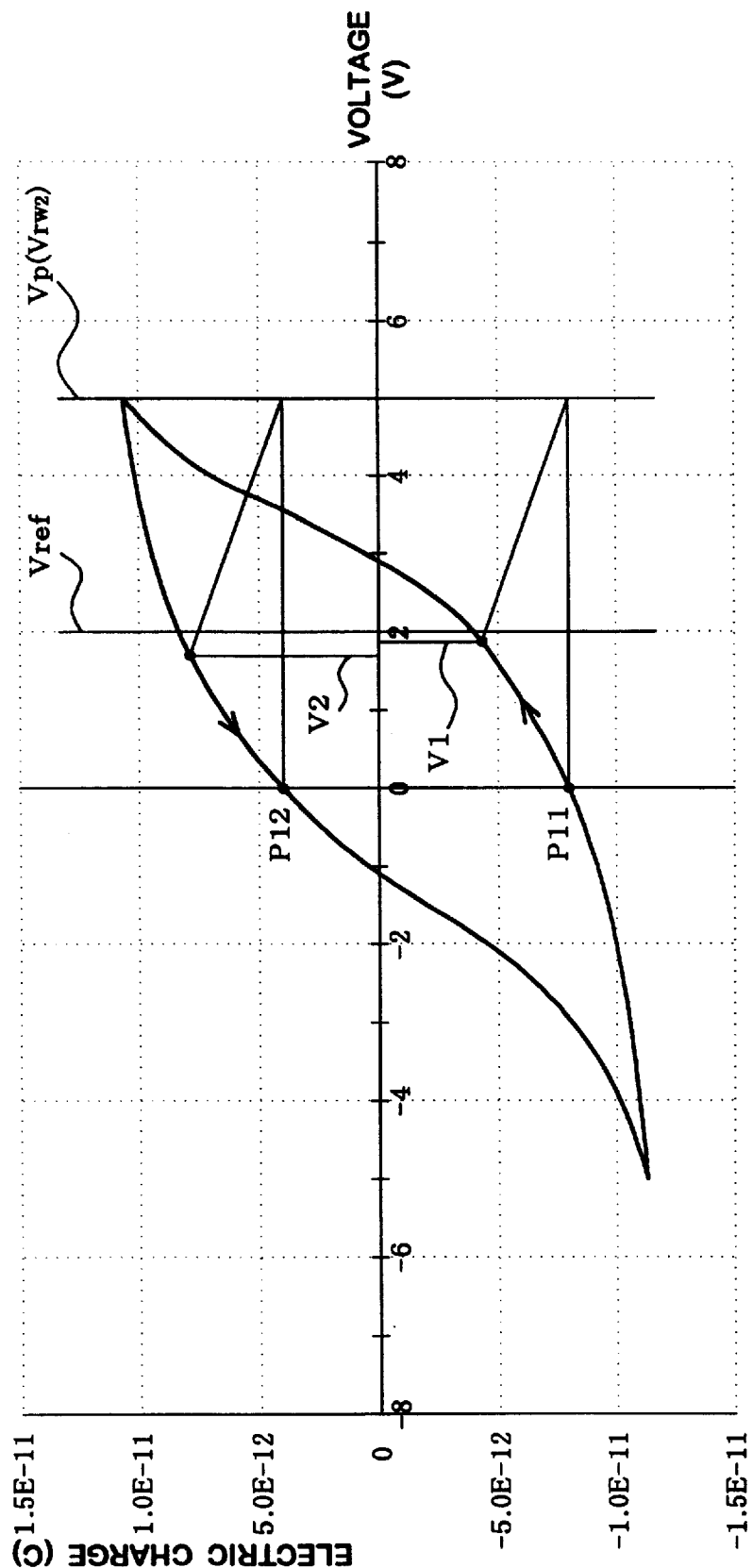
FIG. 8 is a graph which is used to explain operations of a ferroelectric capacitor getting the bad electric property.

FIG. 8 is a hysteresis curve when the data "H" has been stored (in FIG. 7 the polarity state P1 has been kept) for long time. Due to the bad electric property (the imprint effect), the polarity states P1 and P2 of FIG. 7 change to the polarity states P11 and P12 of FIG. 8, respectively.

In read-out operations of this case the data "H" can be read out as described above because the voltage V1 corresponding to the data "H" is on the left of the reference voltage Vref in FIG. 8 the same as shown in FIG. 7. However, when the data "L", which is obtained by reversing the read-out data, is written there occurs the bad case where this data can not be read out. That is because, though as shown in FIG. 7 the voltage V2 corresponding to the data "L" must be on the right of the reference voltage Vref to read it, the voltage V2 is on the left of the reference voltage Vref in FIG. 8.

For this case, as described above, repeating the write of the reversed data (see the step S10) leads to application of such a voltage Vp (Vrw2) to both ends of the ferroelectric capacitor C11 that the one end of the bit line side is negative end of the plate line PL1 side is positive). As a result of this operation, the ferroelectric capacitor C11 gets rid of the bad electric property (the imprint effect) gradually.

The controlling portion 52, on judging that the hysteresis curve has been normalized without the bad electric property, checks on whether or not the address which the address controller 54 shows is the termination address (for example, "FFFF") or not (Step S14). If the address which the address controller 54 shows is not the termination address the address which the address controller 54 shows is incremented. For example, when the address is "0000" the address is incremented to "0001". After that, this operation return to the step S6, and then the controlling portion 52 repeats the series of operations from the step S6 to the step S14. That enables all the ferroelectric capacitors C11, . . . , (corresponding to the addresses "0000" to "FFFF") to get rid of the bad electric property (the imprint effect).

The controlling portion 52, next, gets both the control-of-input-gate signal and the control-of-output-gate signal into a logic "0", thereby getting both the input gate 56 and the output gate 58 into the "reversal-of-operation" state (see FIG. 4). In spite of the fact that all the stored data have been reversed, the operator can perform read-out or write operations without any disadvantage.

For example, when the data which is being stored in the memory cell M11 is "H" and is read out of the memory cell M11, the read-out data is "L" because the data has been changed from "H" to "L" by the reversal and write operations at the step S10. But the read-out data is reversed with the output gate 58 shown in FIG. 2, thereby outputting the data "H" as output data. That is, the same data as the stored data "H" is output. This is also applied to the case where the data stored is "L".

Next, when the operator wants to rewrite the data "L", the data "L" is input as input data of FIG. 2. In this case, the write data is "H" because the input data "L" is reversed with the input gate 56. Therefore, the data "H" is written into the memory cell M11. When this data is read out the read-out data is "H" but the read-out data is reversed with the output gate 58 and thereby is output as the output data "L". That is, when the input data is "L" the same data "L" is output as output data. Similarly, when the input data is "H" the output data is "H".

Finally, the controlling portion 52 performs termination processing such as reset for various counters and then returns to the step S2. That is, the described-above series of operations are performed whenever the memory startup signal is detected (or whenever environment operating is performed in this embodiment in FIG. 2).

As a result of such a configuration, the data which is being stored in the memory cell M11 changes from "H" to "L" or from "L" to "H" whenever the memory startup signal is detected. Therefore, whenever the memory startup signal is detected the memory cell M11 can be changed from the polarity state "P1" to the polarity state "P2" or from the polarity state "P2" to the polarity state "P1". That prevents the memory cell M11 from getting the bad electric property.

While, the input gate 56 and the output gate 58 change from the "non-reversal-of-operation" state to the "reversal-of-operation" state or from the "reversal-of-operation" state to the "non-reversal-of-operation" state whenever the data which is being stored in the memory cell M11 is reversed.

Therefore, in spite of the above fact that the data which is being stored in the memory cell M11 is changed every environment operating, the operator can perform read-out or write operations without any disadvantage.

Though, in the described-above embodiment, the power-on detecting portion 50 is provided in order to detect the power-on and then generate the switch signal (or the memory startup signal), the generation of the switch signal is not limited to the power-on. For example, the switch signal may be generated every certain number of accesses to the memory, or, the switch signal may be generated at intervals of predetermined time using a timer. Also, the switch signal may be generated with interrupts of the external program. Further, the switch signal may be generated not automatically but manually. Also, a combination of them can be designed to generate the switch signal.

Also, though, in the described-above embodiment, the memory is designed so that the write operations with the reversed data can end when the hysteresis curve has been normalized (see the steps S10 and S12), the memory can be designed so that a desired number of write operations with the reversed data can be further performed after the hysteresis curve has been normalized. Specifically, the memory can be designed so that the number of write operations which is necessary to normalize the hysteresis curve can be counted and then the write operations of the number can be further performed after the hysteresis curve has been normalized. Also, the memory can be designed so that a fixed number of write operations can be further performed after the hysteresis curve has been normalized.

Also, though, in the described-above embodiment, the memory is designed so that the write operations with the reversed data can be repeated until the hysteresis curve is normalized, the memory can be designed so that a certain number of write operations with the reversed data can be repeated without checking on whether the hysteresis curve has been normalized.

Also, though, in the described-above embodiment, the memory is designed so that the hysteresis curve can be normalized by means of repeating the write operations with the reversed data, the memory can be designed so that the hysteresis curve can be normalized by means of, after the reversed data has be written, repeating read-out operations with the reversed data. Also, that can be achieved by a combination between the repeat of the write operations with the reversed data and the repeat of the read-out operations with the reversed data.

Also, it can be achieved without using the repeat of the write operations with the reversed data or the repeat of the read-out operations with the reversed data. In this case, after the reversed data has been written this state needs to be left. It is because the hysteresis curve is gradually normalized by leaving the state as time passes even if normalization of the hysteresis curve is still imperfect at that time the reversed data has been written.

Also, though, in the described-above embodiment, the memory is designed so that the input and output gates can be reversed after the stored data has been reversed, the memory can be designed so that after the hysteresis curve has been normalized by means of reversing the stored data the reversed data can be reversed again to return to the former data. In this case, there is no need to reverse the input and output gates.

Figure 9:
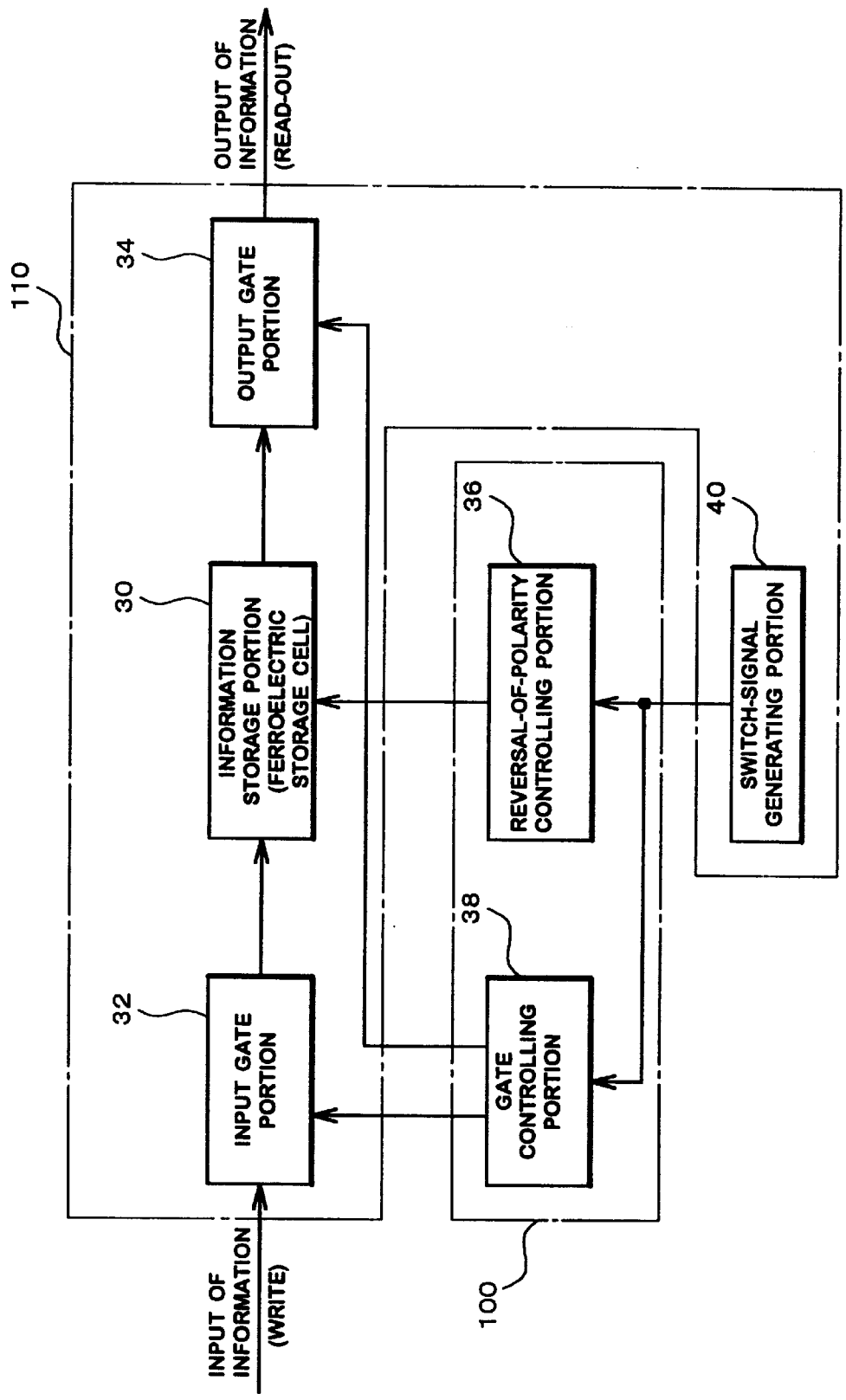
FIG. 9 is a diagram showing a composition of a ferroelectric memory 110 and a controller 100.

Though, in the described-above embodiment, the reversal-of-polarity controlling portion 36 and the gate controlling portion 38 are built in the ferroelectric memory 10, the reversal-of-polarity controlling portion 36 and the gate controlling portion 38 can be provided outside of the ferroelectric memory. FIG. 9 shows a composition of a ferroelectric memory (ferroelectric storage device) 110 and a controller (controlling device) 100 in a block diagram according to this case.

The ferroelectric memory 110 comprises an information storage portion 30, an input gate portion 32, an output gate portion 34 and a switch-signal generating portion 40. The controller 100 comprises a reversal-of-polarity controlling portion 36 and a gate controlling portion 38. The functions of the information storage portion 30, the input gate portion 32, the output gate portion 34, the switch-signal generating portion 40, the reversal-of-polarity controlling portion 36 and the gate controlling portion 38 are almost the same as the case of FIG. 1.

Figure 10:
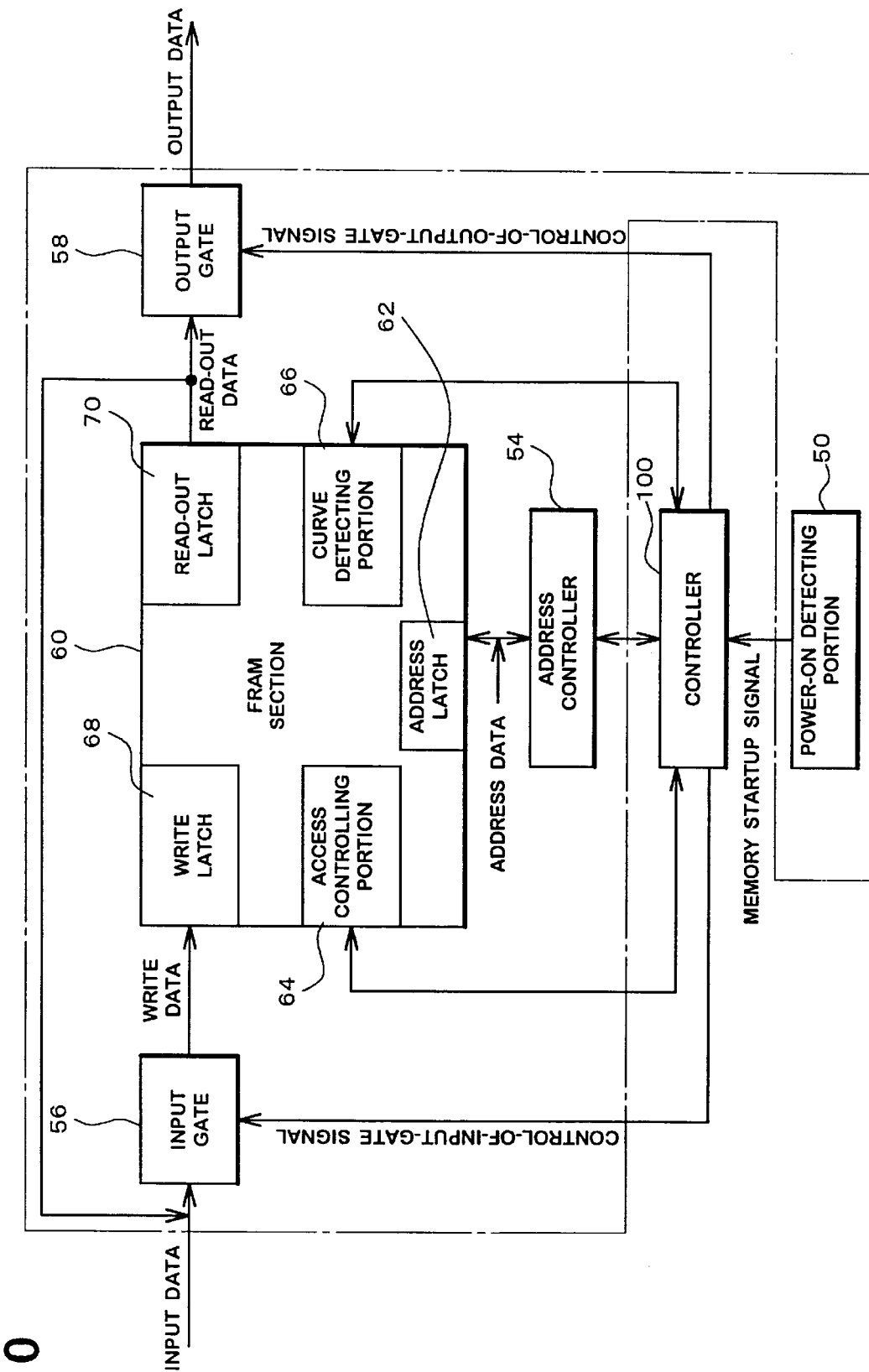
FIG. 10 is a block diagram showing a configuration of a case where a part of the functions of the ferroelectric memory 110 and controller 100 of FIG. 9 are fulfilled using a logic circuit 10.

FIG. 10 shows in a block diagram a configuration of a case where a part of the functions of the ferroelectric memory 110 and controller 100 of FIG. 9 are fulfilled using a logic circuit. The ferroelectric memory 110 comprises a power-on detecting portion 50, an address controller 54, an input gate 56, an output gate 58 and a FRAM section 60.

The power-on detecting portion 50 of the ferroelectric memory 110 shown in FIG. 10 corresponds to the switch-signal generating portion 40 of FIG. 9. The address controller 54 and the FRAM section 60 correspond to the information storage portion 30. The input gate 56 corresponds to the input gate portion 32, and, the output gate 58 corresponds to the output gate portion 34.

While, the controller 100 shown in FIG. 10 corresponds to the reversal-of-polarity controlling portion 36 and the gate controlling portion 38 of FIG. 9. Therefore, the controller 100 in the embodiment of FIG. 10 has the same function as the controlling portion 52 in the described-above embodiment of FIG. 2.

Though, in the embodiment of FIG. 10, the controller 100 having the functions of the reversal-of-polarity controlling portion 36 and the gate controlling portion 38 is used as a control device, the control device is not limited to this. For example, a controller having not only the functions of the reversal-of-polarity controlling portion 36 and the gate controlling portion 38 but also the functions of the input gate portion 32, the output gate portion 34, the switch-signal generating portion and the others can be used as a control device.

Though, in the described-above embodiments, the various functions of the ferroelectric memory 10 or the functions of the ferroelectric memory 110 and the controller 100 are fulfilled using a logic circuit, a part of these functions can be fulfilled using a microcomputer.

Figure 11:
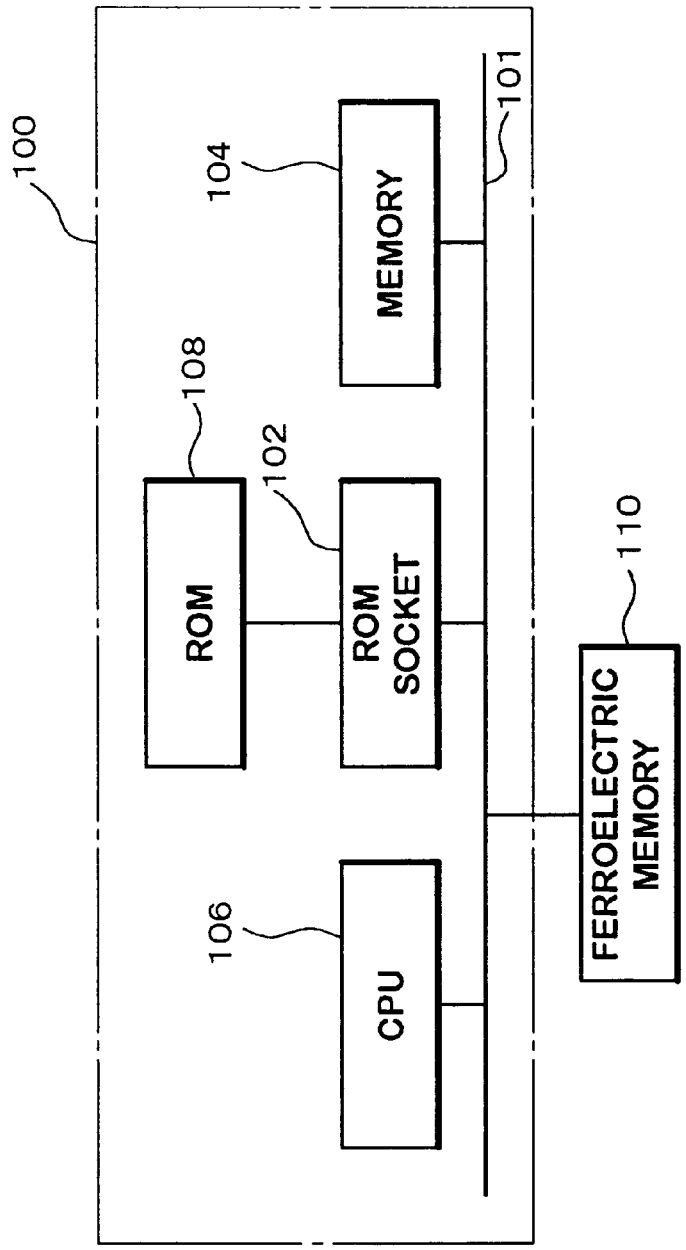
FIG. 11 is an example of hardware of a case where the function of the con roller 100 shown in FIG. 10 is fulfilled using a computer.
Figure 12:
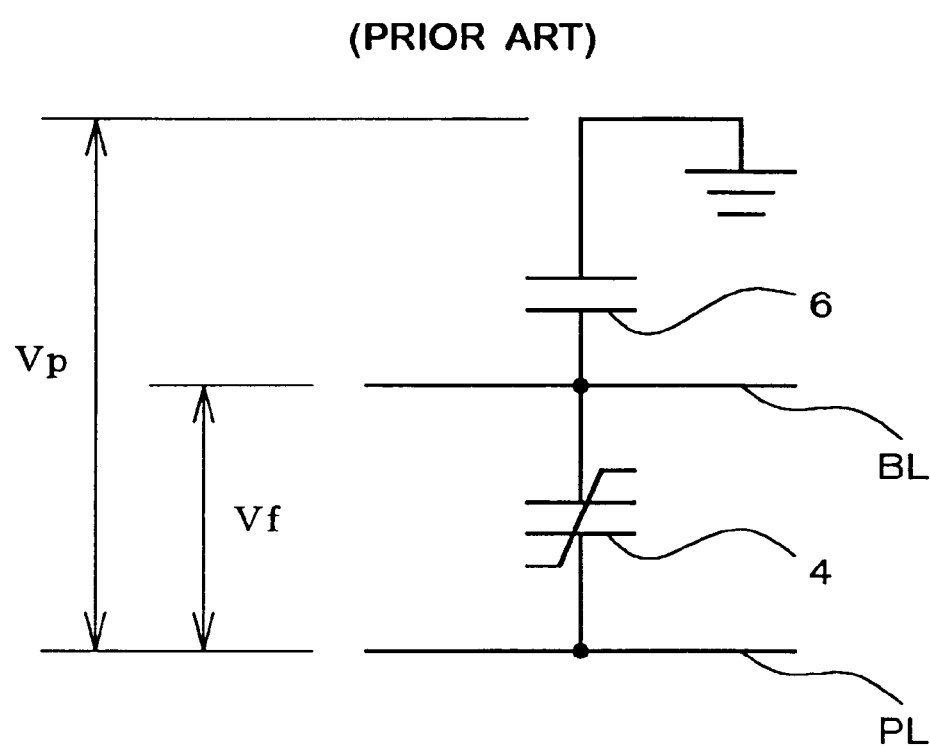
FIG. 12 is a circuit diagram showing a part of a conventional ferroelectric memory.
Figure 13:
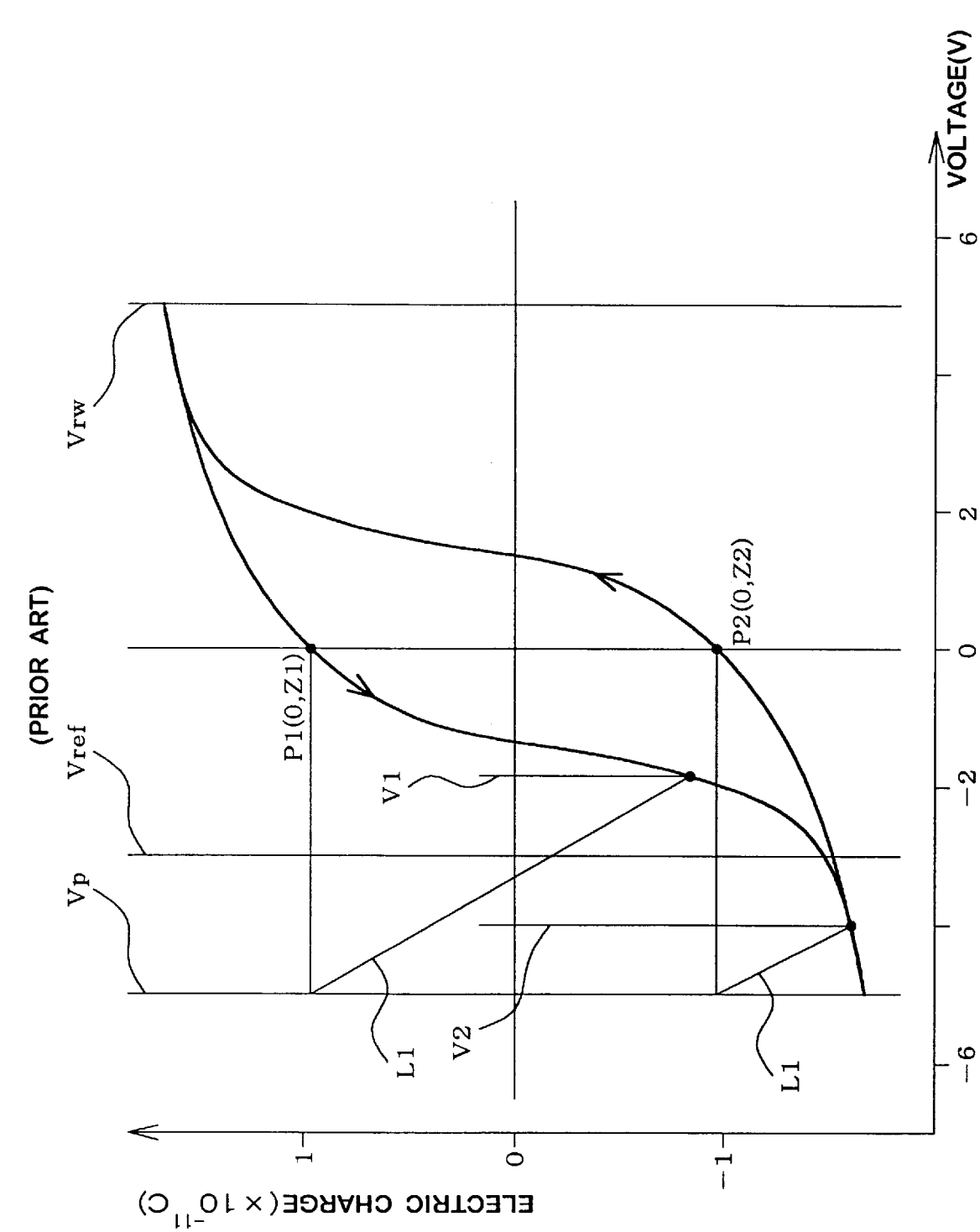
FIG. 13 is a graph which is used to explain operations of a ferroelectric capacitor in the conventional ferroelectric memory.

FIG. 11 shows an example of hardware of a case where the function of the controller 100 shown in FIG. 10 is fulfilled using a microcomputer.

Referring to FIG. 11, the controller 100 comprises a ROM 108 (or storage medium) which is installed in a ROM socket 102. In the ROM 108, the processing procedures shown in the flowchart of FIG. 5 are stored. Into the memory 104, the program stored in the ROM 108 is loaded. The CPU 106 executes the program loaded into the memory 104.

The memory startup signal, the input-gate signal, the output-gate signal and the others (see FIG. 10) are shuttlecock between the CPU 106 and the ferroelectric memory 110 via a bus 101.

Though, in this embodiment, the ROM 108 installed in the ROM socket 102 is used as a storage medium as shown in FIG. 11, when a so-called one-chip microcomputer is used as the computer a ROM portion (not shown) which the one-chip microcomputer has can be used as the storage medium.

As described above, the computer performs each function under the program stored in the ROM. Note that, though not shown, a computer with a hard disk can be provided and then each function can be performed under the program stored in the hard disk. In this case, the program, for example, is read out of a flexible disk in the FDD (flexible disk drive) and is installed in the hard disk.

Besides the flexible disk, the program may be read out of computer readable storage mediums such as the CD-ROM, the IC card which are used to store programs and be installed in the hard disk. Further, the program is downloaded into the computer via a communication line.

Also, besides a case where the program is designed to be installed to the hard disk from the flexible disk and thereby indirectly executed by the computer, for example, the computer may directly execute the program stored in the flexible disk.

Note that the executable program includes what needs to be once converted to the other forms,(for example, what has compressed data) and what needs to be combined with another module, not to speak of what is directly executed by installing the program as it is.

Though, in this embodiment, the function of the controller 100 shown in FIG. 10 is fulfilled using the computer, the function of the controlling portion 52 can be fulfilled using the computer.

Also, though, in the described-above, the ferroelectric storage cells composing the ferroelectric storage device are each composed of one transistor and one capacitor, this invention is not limited to this. For example, this invention can be applied to a ferroelectric storage device having ferroelectric storage cells each of which is composed of two transistors and two capacitors, a ferroelectric storage device having ferroelectric storage cells each of which is composed of one transistor, such as MFMIS-FET (Metal-Ferroelectric-Metal-Isolater-Silicon-FET), and the other ferroelectric storage devices.

Also, though, in the described-above embodiment, the ferroelectric storage cells composing the ferroelectric storage device are capable of dealing with two kinds of polarity states associated with two kinds of data (specifically, "H" and "L"), this invention is not limited to this. For example, this invention can be applied to a ferroelectric storage device having ferroelectric storage cells which are capable of dealing with three kinds of polarity states associated with three kinds of data (for example, "H", "M" and "L"). In this case, when the stored data is "H" the storage device is designed so that this data can be rewritten in the order of "M, L, H . . ." whenever the switch signal is generated.

This invention is characterized in that the association between the data and the polarity state is changeable on a switch signal.

Therefore, the polarity state can be changed if required with the same data being stored in the ferroelectric storage cell. That can prevent the ferroelectric storage cell from getting the ad electric property (imprint effect) even when the same data is stored for long time. That fact leads to the semipermanent use of the ferroelectric storage cell.

This invention is characterized in that the ferroelectric storage cell is designed to hold the first polarity state or the second polarity, the first and second polarity states being associated with two kinds of data to be stored, and that, on the switch signal, the ferroelectric storage cell changes from a present polarity state to the other polarity state and further the input and output gates change from the "non-reversal-of-operation" state to the "reversal-of-operation" state or from the "reversal-of-operation" state to the "non-reversal-of-operation" state.

Therefore, in the ferroelectric storage device dealing with two kinds of data, the polarity state can be changed if required with the same data being stored in the ferroelectric storage cell.

Also, the input and output gate can changed in its operation state with the change in the polarity of ferroelectric. Therefore, the operator can perform read-out or write operations without any disadvantage.

This invention is characterized in that the input gate portion and the output gate portion are provided, and also the reversal-of-polarity controlling portion is provided to reverse polarity states of the ferroelectric storage cells composing the information storage portion on the switch signal, and further the gate controlling portion is provided to switch both the input gate portion and the output gate portion from the "non-reversal-of-operation" state to the "reversal-of-operation" state or from the "reversal-of-operation" state to the "non-reversal-of-operation" state Therefore, by making the reversal-of-polarity controlling portion work on the switch signal, the polarity state of the ferroelectric storage cell can be changed. Also, by making the gate controlling portion work on the switch signal, the input and output portions can be controlled so as to change them to a proper operation state. That is, with such a simple composition the association between data and polarity state can be changed.

This invention is characterized in that on the switch signal the polarity state of the ferroelectric storage cell is changed and a certain number of write operations or read-out operations are performed on the ferroelectric storage cell so as to further move the polarity state in the direction of the changed polarity.

This operation, where the write operations or the read-out operation on the ferroelectric cells are repeated so as to further move the polarity state in the direction of the changed polarity, enables a more high voltage to be applied thereto than a case where the changed polarity is being hold. Therefore, the ferroelectric cell can get rid of the bad electric property (the imprint effect) more effectively.

This invention is characterized in that on the switch signal the polarity state of the ferroelectric storage cell is changed, and, a certain number of write operations or read-out operations are performed on the ferroelectric storage cell so as to further move the polarity state in the direction of the changed polarity and then the ferroelectric storage cell is changed back into the previous polarity state.

By repeating the write operations or the read-out operation on the ferroelectric cells so as to further move the polarity state in the direction of the changed polarity, a high voltage can be applied thereto. Therefore, the ferroelectric cell can get rid of the bad electric property (the imprint effect) more effectively. Only a repeat of these operations enable the ferroelectric storage cell to get rid of the bad electric property to some extents. As a result of that, by changing back the ferroelectric storage cell into the previous polarity state, such a simple composition can prevent this storage cell from getting the bad electric property.

This invention is characterized in that the switch signal is automatically generated in predetermined timing. That can automatically prevent this storage cell from getting the bad electric property without any disadvantage.

This invention is characterized in that on the switch signal the polarity state of the ferroelectric storage cell is changed, and, a certain number of write operations or read-out operations are performed on the ferroelectric storage cell so as to further move the polarity state in the direction of the changed polarity and then the input gate and output gate portions are both changed from a "non-reversal-of-operation" state to a "reversal-of-operation" state or from a "reversal-of-operation" state to a "non-reversal-of-operation" state.

By repeating the write operations or the read-out operations on the ferroelectric cells so as to further move the polarity state in the direction of the changed polarity, a high voltage can be applied thereto. Therefore, the ferroelectric cell can get rid of the bad electric property (the imprint effect) more effectively. Also, by changing the input gate and output gate portions from a "non-reversal-of-operation" state to a "reversal-of-operation" state or from a "reversal-of-operation" state to a "non-reversal-of-operation" state without changing the reversed direction of polarity, the ferroelectric storage cell can get rid of the bad electric property without the data stored in the ferroelectric storage cell being substantially changed.

Having described preferred embodiments of the invention, it is to be understood that the terms used may be changed without departing from the scope or spirit of the invention as defined in the appended claims because they are used not for limitation but for explanation.

What is claimed is:

1. A ferroelectric storage device comprising a ferroelectric storage cell which is capable of holding a polarity state to store data, the polarity state being associated with the data, wherein the association between the data and the polarity state is changeable on a switch signal;

said ferroelectric storage cell is designed to hold a first polarity state or a second polarity state the direction of which is different from that of the first polarity state, the first and second polarity states being associated with two kinds of data to be stored, and, on the switch signal, the ferroelectric storage cell changes from a present polarity state to the other polarity state and the ferroelectric storage device changes from a "non-reversal-of-operation" state to a "reversal-of-operation" state or from a "reversal-of-operation" state to a "non-reversal-of-operation" state, the "non-reversal-of-operation" state being a state where in write operations input data is written into the ferroelectric storage cell as it is and in read-out operations read-out data is output as it is, and, the "reversal-of-operation" state is a state where in write operations input data is written into the ferroelectric storage cell as it is reversed and in read-out operations read-out data is output as it is reversed.

2. A ferroelectric storage device in accordance with the claim 1 comprising:

an information storage portion which has said ferroelectric storage cell and has ability to write data into its storage cell and to read data out of its storage cell, an input gate portion for sending input data to said information storage portion as it is or as it is reversed on a certain control-of-input-gate signal in write operations, an output gate portion for outputting read-out data as it is or as it is reversed on a certain control-of-output-gate signal in read-out operations, a reversal-of-polarity controlling portion for reversing a polarity state in said ferroelectric storage cell of said information storage portion on the switch signal, and, a gate controlling portion for generating the control-of-input-gate signal and the control-of-output-gate signal on the switch signal and thereon switching both said input gate portion and said output gate portion from the "non-reversal-of-operation" state to the "reversal-of-operation" state or from the "reversal-of-operation" state to the "non-reversal-of-operation" state.

3. A ferroelectric storage device comprising a ferroelectric storage cell which is capable of holding a polarity state to store data, the polarity state being associated with the data, wherein the association between the data and the polarity state is changeable on a switch signal; and wherein on the switch signal the polarity state of said ferroelectric storage cell is changed, and, a certain number of write operations or read-out operations are performed on said ferroelectric storage cell so as to further move the polarity state in the direction of the changed polarity.

4. A ferroelectric storage device in accordance with the claim 3, wherein information is read from the hysteresis character of said ferroelectric storage cell and on the basis of the read information on the hysteresis character the certain number is determined.

5. A ferroelectric storage device in accordance with the claim 3, wherein the certain number is predetermine and fixed.

6. A ferroelectric storage device comprising a ferroelectric storage cell which is capable of holding a polarity state to store data, the polarity state being associated with the data, wherein the association between the data and the polarity state is changeable on a switch signal; and wherein said ferroelectric storage cell comprises a ferroelectric capacitor which is capable of holding a polarity state associated with data to be stored and a capacitor for load which is electrically connected with said ferroelectric capacitor in series, and, wherein stored data can be read out using a voltage occurring in said ferroelectric capacitor when a certain voltage is applied to said ferroelectric capacitor and said capacitor for load which are electrically connected in series.

7. A ferroelectric storage device comprising a ferroelectric storage cell which is capable of holding a first polarity state or a second polarity state the direction of which is different from that of the first polarity state, the first and second polarity states being associated with two kinds of data to be stored, wherein on a certain switch signal the polarity state of said ferroelectric storage cell is changed while maintaining information contents, and, a certain number of write operations or read-out operations are performed on said ferroelectric storage cell so as to further move the polarity state in the direction of the changed polarity and then the ferroelectric storage cell is changed back into the previous polarity state.

8. A ferroelectric storage device in accordance with the claim 7, wherein information is read from the hysteresis character of said ferroelectric storage cell and on the basis of the read information on the hysteresis character the certain number is determined.

9. A ferroelectric storage device in accordance with the claim 7, wherein the certain number is predetermined and fixed.

10. A ferroelectric storage device in accordance with the claim 7, wherein the switch signal is automatically generated in predetermined timing.

11. A ferroelectric storage device in accordance with the claim 10, wherein the switch signal is generated whenever the ferroelectric storage device turns on.

12. A ferroelectric storage device in accordance with the claim 10, wherein the switch signal is generated every a certain number of accesses to said ferroelectric storage device.

13. A ferroelectric storage device comprising a ferroelectric storage cell which is capable of holding a first polarity state or a second polarity state the direction of which is different from that of the first polarity state, the first and second polarity states being associated with two kinds of data to be stored, wherein on a certain switch signal the polarity state of said ferroelectric storage cell is changed, and, a certain number of write operations or read-out operations are performed on said ferroelectric storage cell so as to further move the polarity state in the direction of the changed polarity and then the ferroelectric storage cell is changed back into the previous polarity state; and wherein said ferroelectric storage cell comprises a ferroelectric capacitor which is capable of holding a polarity state associated with data to be stored and a capacitor for load which is electrically connected with said ferroelectric capacitor in series, and, wherein stored data can be read out using a voltage occurring in said ferroelectric capacitor when a certain voltage is applied to said ferroelectric capacitor and said capacitor for load which are electrically connected in series.

14. A controlling device for controlling a ferroelectric storage device comprising a ferroelectric storage cell which is capable of holding a first polarity state or a second polarity state the direction of which is different from that of the first polarity state, the first and second polarity states being associated with two kinds of data to be stored, wherein on a certain switch signal the polarity state of said ferroelectric storage cell is changed, and, a certain number of write operations or read-out operations are performed on said ferroelectric storage cell so as to further move the polarity state in the direction of the changed polarity and then the ferroelectric storage device is changed from a "non-reversal-of-operation" state to a "reversal-of-operation" state or from a "reversal-of-operation" state to a "non-reversal-of-operation" state, the "non-reversal-of-operation" state being a state where in write operations input data is written into the ferroelectric storage cell as it is and in read-out operations read-out data is output as it is, and, the "reversal-of-operation" state is a state where in write operations input data is written into the ferroelectric storage cell as it is reversed and in read-out operations read-out data is output as it is reversed.

15. A controlling device for controlling a ferroelectric storage device comprising a ferroelectric storage cell which is capable of holding a first polarity state or a second polarity state the direction of which is different from that of the first polarity state, the first and second polarity states being associated with two kinds of data to be stored, wherein on a certain switch signal the polarity state of said ferroelectric storage cell is changed, and, a certain number of write operations or read-out operations are performed on said ferroelectric storage cell so as to further move the polarity state in the direction of the changed polarity and then the ferroelectric storage cell is changed back into the previous polarity state.

16. A computer readable storage mediums storing an executable computer program which is used to control a ferroelectric storage device comprising a ferroelectric storage cell which is capable of holding a first polarity state or a second polarity state the direction of which is different from that of the first polarity state, the first and second polarity states being associated with two kinds of data to be stored, wherein the program makes a computer, on a certain switch signal, change the polarity state of said ferroelectric storage cell, perform a certain number of write operations or read-out operations on said ferroelectric storage cell so as to further move the polarity state in the direction of the changed polarity and then change the ferroelectric storage device from a "non-reversal-of-operation" state to a "reversal-of-operation" state or from a "reversal-of-operation" state to a "non-reversal-of-operation" state, the "non-reversal-of-operation" state being a state where in write operations input data is written into the ferroelectric storage cell as it is and in read-out operations read-out data is output as it is, and, the "reversal-of-operation" state is a state where in write operations input data is written into the ferroelectric storage cell as it is reversed and in read-out operations read-out data is output as it is reversed.

17. A computer readable storage mediums storing an executable computer program which is used to control a ferroelectric storage device comprising a ferroelectric storage cell which is capable of holding a first polarity state or a second polarity state the-direction of which is different from that of the first polarity state, the first and second polarity states being associated with two kinds of data to be stored, wherein the program makes a computer, on a certain switch signal, change the polarity state of said ferroelectric storage cell, perform a certain number of write operations or read-out operations on said ferroelectric storage cell so as to further move the polarity state in the direction of the changed polarity and then change back the ferroelectric storage cell to the previous polarity state.

* * * * *